United States Patent
Ogino et al.

(10) Patent No.: US 6,522,367 B1
(45) Date of Patent: Feb. 18, 2003

(54) CABLE TELEVISION (CATV) TUNER FOR ENHANCED SIGNAL COMMUNICATION BETWEEN SUBSCRIBERS IN A CATV SYSTEM

(75) Inventors: Toshikazu Ogino, Atsugi (JP); Masashige Yamasaki, deceased, late of Atsugi (JP); Hayato Shibano, Atsugi (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 09/467,434

(22) Filed: Dec. 20, 1999

(30) Foreign Application Priority Data

Dec. 24, 1998 (JP) ............................................. 10-368096

(51) Int. Cl.$^7$ ................................................. H04N 5/50
(52) U.S. Cl. ........................ 348/731; 348/707; 725/151
(58) Field of Search ................................. 348/707, 725, 348/726, 731, 732, 678; 725/151; 455/226.3, 311, 307, 308, 323, 326; 330/149

(56) References Cited

U.S. PATENT DOCUMENTS

| | | | |
|---|---|---|---|
| 4,520,507 A | | 5/1985 | Moon ............................. 455/3 |
| 5,276,904 A | * | 1/1994 | Mutzig et al. ................. 455/32 |
| 5,722,062 A | | 2/1998 | Nakanishi et al. ........ 455/247.1 |
| 5,781,847 A | * | 7/1998 | Clarke et al. .................. 455/69 |
| 5,903,827 A | * | 5/1999 | Kennan et al. .............. 455/326 |
| 5,930,696 A | | 7/1999 | Tzuang et al. ............... 455/311 |
| 6,075,497 A | * | 6/2000 | Chen et al. .................. 343/840 |
| 6,177,964 B1 | * | 1/2001 | Birleson et al. ............. 348/725 |

FOREIGN PATENT DOCUMENTS

WO          98/58447          12/1998

\* cited by examiner

*Primary Examiner*—Victor R. Kostak
(74) *Attorney, Agent, or Firm*—Ladas & Parry

(57) ABSTRACT

A CATV tuner apparatus includes a first low-noise amplifier which amplifies a level of an input signal received at an input terminal, the first low-noise amplifier having an adequately small noise figure to allow the received input signal to be amplified with no substantial degradation of a carrier-to-noise ratio of the input signal. An automatic gain control detects the level of the signal amplified by the first low-noise amplifier and adjusts an amplitude of the signal before passing the signal through the automatic gain control. A band-pass filter eliminates out-of-band signal components from the signal received from the automatic gain control and passes only in-band signal components through the band-pass filter. A second low-noise amplifier amplifies a level of the signal received from the band-pass filter. A frequency synthesizer produces an intermediate frequency signal at an output terminal through a multiplication of a frequency of the signal, amplified by the second low-noise amplifier, by an oscillation frequency.

8 Claims, 3 Drawing Sheets

CABLE TELEVISION (CATV) TUNER FOR ENHANCED SIGNAL COMMUNICATION BETWEEN SUBSCRIBERS IN A CATV SYSTEM

BACKGROUND OF THE INVENTION (1) Field of the Invention

The present invention relates to a CATV (cable television) tuner apparatus which receives a voice signal delivered on a CATV channel.

(2) Description of the Related Art

A CATV system is usually configured by using a coaxial cable to carry a CATV signal from central equipment. For example, FIG. 3 shows a configuration of the CATV system of this type.

In the CATV system of FIG. 3, central equipment 20 and a plurality of bidirectional trunk amplifiers 10 through 19 are linked together by a coaxial cable having a relatively large diameter. This trunk cable runs through the CATV system distributing the CATV signal to each neighborhood. Each of the trunk amplifiers 10–19 includes feeder lines that branch off the trunk typically use a smaller diameter cable to carry the signal into the neighborhoods passing each subscriber's home. In FIG. 3, "A" denotes a subscriber connected to the trunk amplifier 19, "B" denotes another subscriber connected to the trunk amplifier 13, and "C" denotes another subscriber connected to the trunk amplifier 16.

CATV signals from the central equipment 20 are usually distributed on the trunk cable at a certain level per channel. It is necessary that the signal level delivered to the home is higher than the desired lowest level per channel. In order to maintain the signal level, the trunk amplifiers 10–19 are spaced along the lines at certain distances that are less than a permissible maximum distance.

The trunk amplifiers 10–19 serve to branch the CATV signal transmitted by the central equipment 20 downstream to subscribers and to deliver it to the individual subscribers. Further, the trunk amplifiers 10–19 serve to insert the subscriber information into the signal delivered upstream to the central equipment 20. Hence, the two-way communications between the subscribers and the central equipment 20 are carried out with the CATV system.

In the CATV system of FIG. 3, video information is delivered from the central equipment 20 to the trunk amplifiers 10, 14, 17, 18 and 19 on the trunk cable along the downstream path, in this order. For example, the. trunk amplifier 19 branches the video signal from the central equipment 20 and supplies it to the subscriber A connected to the trunk amplifier 19. Further, the trunk amplifier 19 inserts subscriber information from the subscriber A into the signal that is delivered upstream to the central equipment 20 in the opposite direction.

FIG. 2 shows a CATV tuner apparatus according to the related art. Specifically, the CATV tuner apparatus of FIG. 2 is applicable to an input module of a CATV tuner. The CATV tuner is located at each subscriber's home and connected through a coaxial cable to one of the plurality of trunk amplifiers within the CATV system of FIG. 3.

As shown in FIG. 2, the CATV tuner apparatus according to the related art includes a tracking filter 1, a band-pass filter (BPF) 2, an automatic gain control (AGC) 3, an amplifier (AMP) 4, a band-pass filter (BPF) 5, a frequency synthesizer (FS) 6, and a local oscillator (OSC) 7. In FIG. 2, reference numeral 8 denotes an input module of a CATV tuner located at each subscriber's home. The local oscillator 7 generates a predetermined oscillation frequency which is supplied to the frequency synthesizer 6.

In the CATV tuner apparatus of FIG. 2, the tracking filter 1 serves to perform, through a filtering process, a channel selection in which a specific one of multiple CATV channels delivered on the coaxial cable is selected, based on an input signal Vin (for example, a video signal) received at an input terminal of the apparatus. The band-pass filter 2 eliminates the out-of-band noise components from the received signal from the tracking filter 1 and passes only the in-band signal components through the band-pass filter 2.

In the CATV tuner apparatus of FIG. 2, the automatic gain control 3 detects the level of the signal received from the band-pass filter 2, and either increases or decreases the amplitude of the signal before passing the signal to the amplifier 4. Each of the tracking filter 1, the band-pass filter 2 and the automatic gain control 3 will attenuate the level of the received input signal Vin. The amplifier 4 amplifies the level of the signal received from the automatic gain control 3. The band-pass filter 5 eliminates the out-of-band noise components from the received signal from the amplifier 4 and passes only the in-band signal components through the band-pass filter 5. The frequency synthesizer 6 produces an intermediate-frequency (IF) signal through a multiplication (or a division) of a frequency of the signal, received from the band-pass filter 5, by the oscillation frequency supplied by the local oscillator 7. In the CATV tuner apparatus of FIG. 2, the IF signal output by the frequency synthesizer 6 is supplied to the output terminal.

Referring back to FIG. 3, in the above-described CATV system, when the CATV signal is delivered from the central equipment 20 to the CATV tuner apparatus (or the subscriber's home) via some of the trunk amplifiers 10–19, or vice versa, the signal level delivered to the CATV tuner apparatus is maintained at an appropriate level by the bidirectional trunk amplifiers. For example, in a case of the signal transmission between the central equipment 20 and the subscriber A, the signal level delivered to the CATV tuner apparatus (connected to the trunk amplifier 19) is maintained at the appropriate level by the transit trunk amplifiers 10, 14, 17, 18 and 19. In a case of the signal transmission between the central equipment 20 and the subscriber B, the signal level delivered to the CATV tuner apparatus (connected to the trunk amplifier 13) is maintained at the appropriate level by the transit trunk amplifiers 10, 11, 12 and 13.

However, in a case of the transmission of a voice signal between the subscriber A and the subscriber B over the CATV system of FIG. 3, the signal level delivered to the CATV tuner apparatus is not properly maintained at the appropriate level. The signal transmission from the subscriber A to the trunk amplifier 10 in the upstream direction may be performed such that the signal level delivered to the trunk amplifier 10 is properly maintained by the transit trunk amplifiers. However, the subsequent transmission of the same signal from the trunk amplifier 10 to the subscriber B has to be performed in the downstream direction, and the signal level delivered to the subscriber B is not properly maintained by the transit trunk amplifiers. In the above case, the signal level delivered to the CATV tuner apparatus on the receiver side becomes too low.

In the case of the voice signal transmission between the subscribers over the CATV system, such as that shown in FIG. 3, the following problems will arise with the CATV tuner apparatus of FIG. 2 because the level of the input signal Vin received at the input terminal is quite low.

1. The level of the received input signal is significantly low, and the tracking filter 1, the BPF 2 and the AGC 3 of the CATV tuner apparatus of FIG. 2 act to attenuate the level of the received signal and add a certain noise to the received input signal. The carrier-to-noise ratio (CNR) of the received signal will deteriorate considerably. In a case of the reception of an analog voice signal, the quality of the reproduced signal deteriorates. In a case of the reception of a digital voice signal, the bit error rate of the received signal is raised.
2. In a case of the reception of a digital audio signal from another node over the CATV system, the bit error rate of the received signal will be significantly raised. It is difficult that the CATV tuner apparatus of FIG. 2 produces a high quality signal from the received signal.
3. When the voice signal is received by using one of a large number of CATV channels (for example, 700 channels) on the coaxial cable, a CNR degradation of the received signal caused-by interchannel influences is more severe. It is difficult that the CATV tuner apparatus of FIG. 2 provides a stable signal reception capability.

SUMMARY OF THE INVENTION

An object of the present invention is to provide an improved CATV tuner apparatus in which the above-described problems are eliminated.

Another object of the present invention is to provide a CATV tuner apparatus which effectively minimizes the bit error rate of the received input signal and produces a high quality IF signal from the received input signal even when the level of the voice signal delivered between the subscribers over the CATV system is significantly low.

The above-mentioned objects of the present invention are achieved by a CATV tuner apparatus which receives an input signal at an input terminal and produces an intermediate frequency signal at an output terminal from the input signal, the apparatus including: a first low-noise amplifier which amplifies a level of the input signal received at the input terminal, the first low-noise amplifier having an adequately small noise figure to allow the received input signal to be amplified with no substantial degradation of a carrier-to-noise ratio of the input signal; an automatic gain control which detects the level of the signal amplified by the first low-noise amplifier and adjusts an amplitude of the signal before passing the signal through the automatic gain control; a band-pass filter which eliminates out-of-band noise components from the signal received from the automatic gain control and passes only in-band signal components through the band-pass filter; a second low-noise amplifier which amplifies a level of the signal received from the band-pass filter; and a frequency synthesizer which produces the intermediate frequency signal at the output terminal through a multiplication of a frequency of the signal, amplified by the second low-noise amplifier, by an oscillation frequency.

In the CATV tuner apparatus of the present invention, the use of the first low-noise amplifier at the input terminal and the second low-noise amplifier at the output of the band-pass filter enables a minimum of noise to be added to the received input signal, and allows the CATV tuner apparatus of the present invention to produce a high-quality intermediate frequency (IF) signal at the output terminal without substantial carrier-to-noise ratio (CNR) degradation. In a case of the reception of a digital audio signal from another node over the CATV system, the CATV tuner apparatus of the present invention is effective in minimizing the bit error rate of the received signal and producing a high quality IF signal. Further, in a case of a CNR degradation of the received signal caused by interchannel influences, the CATV tuner apparatus of the present invention is effective in providing a stable signal reception capability.

BRIEF DESCRIPTION OF THE DRAWINGS

Other objects, features and advantages of the present invention will become more apparent from the following detailed description when read in conjunction with the accompanying drawings in which.

DETAILED DESCRIPTION OF THE PREFERRED EMBODIMENT

A description will now be given of the preferred embodiment of the invention with reference to the accompanying drawings.

Figure 1:
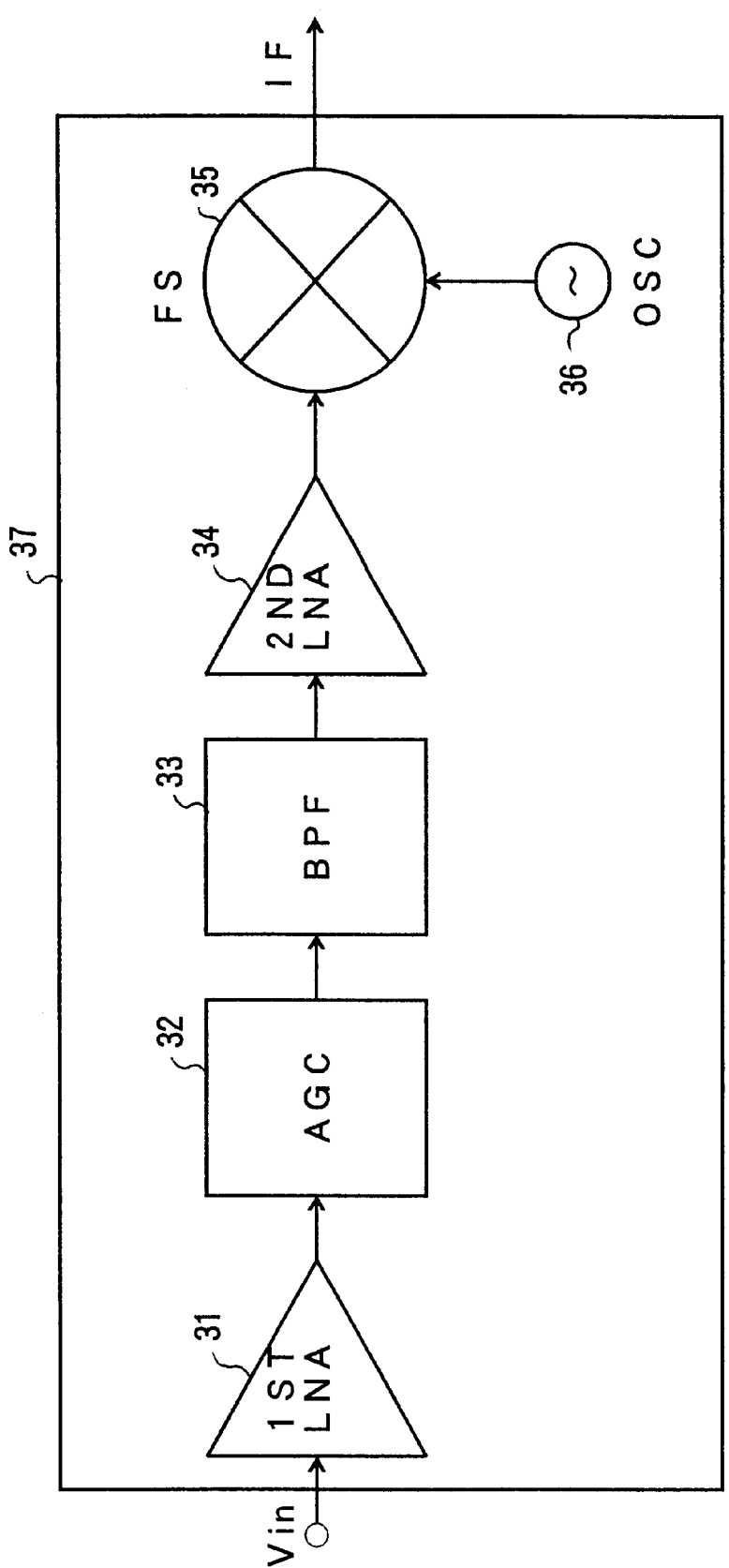
FIG. 1 is a block diagram of a preferred embodiment of the CATV tuner apparatus according to the present invention.

FIG. 1 shows one preferred embodiment of the CATV tuner apparatus according to the invention.

Figure 3:
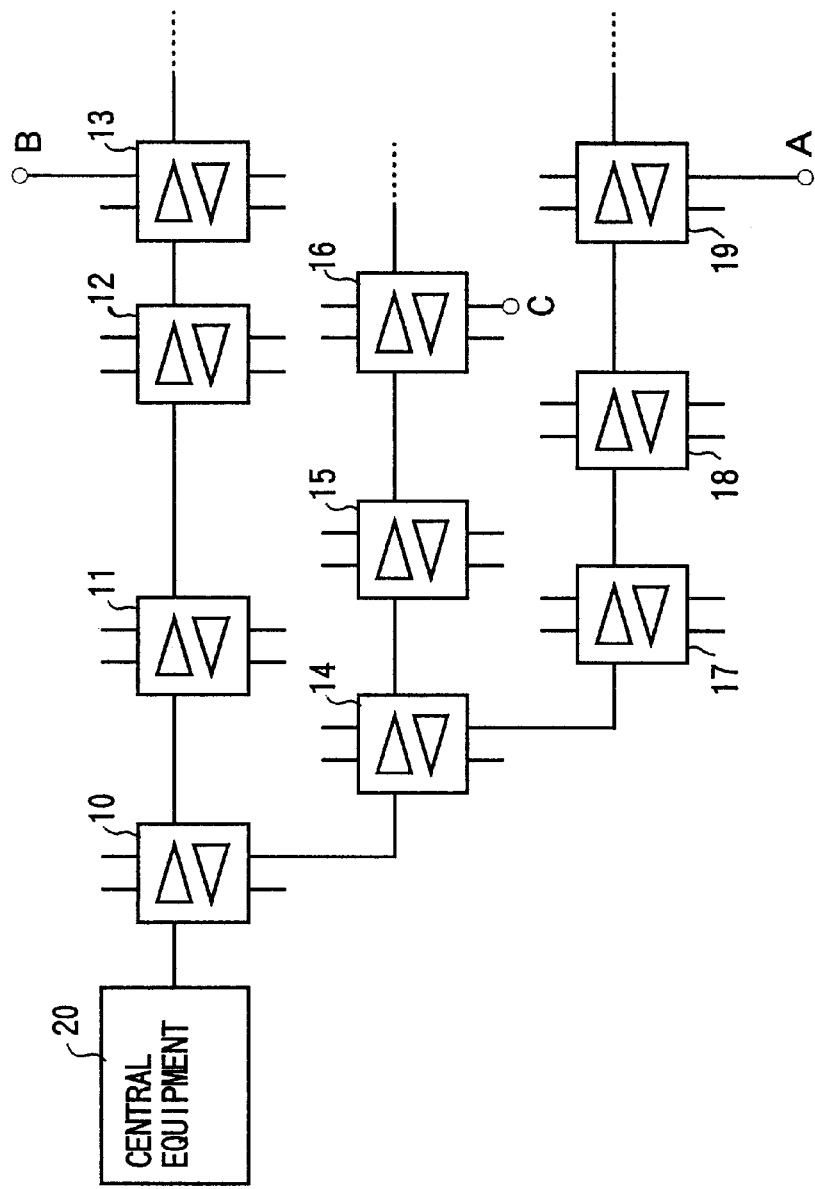
FIG. 3 is a diagram for explaining a configuration of a CATV system.

Specifically, the CATV tuner apparatus of FIG. 1 is applicable to an input module of a CATV tuner. The CATV tuner is located at each subscriber's home and connected through a coaxial cable to one of the plurality of trunk amplifiers within the CATV system of FIG. 3.

As shown in FIG. 1, the CATV tuner apparatus of the present embodiment includes a first low-noise amplifier (1ST LNA) 31, an automatic gain control (AGC) 32, a band-pass filter (BPF) 33, a second low-noise amplifier (2ND LNA) 34, a frequency synthesizer (FS) 35, and a local oscillator (OSC) 36. In FIG. 1, reference numeral 37 denotes the input module of the CATV tuner located at each subscriber's home. The local oscillator 36 generates a predetermined oscillation frequency which is supplied to the frequency synthesizer 35.

The first low-noise amplifier 31 amplifies the level of an input signal Vin (which is either a video signal or a voice signal) received at an input terminal of the CATV tuner apparatus. The first low-noise amplifier 31 is configured to have an adequately small noise figure to allow the received input signal Vin, even if the level of the input signal Vin is very low, to be amplified with no substantial degradation of the carrier-to-noise ratio (CNR).

Generally, amplifiers will add some noise (such as a thermal noise or shot noise) to the signal passing through the amplifier, and this will result in a degradation of the signal-to-noise ratio (SNR). The SNR degradation during the amplification process is quantized through a parameter NF (normally denoted as the amplifier noise figure) which is defined as the SNR ratio between the input and the output: NF=SNRin/SNRout. It is a common practice to refer the SNR to the electrical power generated when the signal is amplified.

Since the amplifier deteriorates the signal-to-noise ratio, that is, SNRin>SNRout, the noise figure NF will always obey the relation NF>1. In the present embodiment, the first low-noise amplifier 31 is configured to have an adequately small noise figure NF to allow the input signal Vin to be amplified with no substantial degradation of the carrier-to-noise ratio CNR.

In the CATV tuner apparatus of FIG. 1, the automatic gain control 32 detects the level of the signal amplified by the amplifier 31, and either increases or decreases the amplitude of the signal before passing the signal to the band-pass filter 33. The band-pass filter 33 eliminates the out-of-band noise components from the received signal, and passes only the in-band signal components through the band-pass filter 33.

In the CATV tuner apparatus of FIG. 1, the second low-noise amplifier 34 amplifies the level of the signal received from the BPF 33. Similar to the first low-noise amplifier 31, the second low-noise amplifier 34. is configured to have an adequately small noise figure to allow the received signal to be amplified with no substantial degradation of the carrier-to-noise ratio. The frequency synthesizer 35 produces an intermediate-frequency (IF) signal through a multiplication (or a division) of the amplified signal frequency from the second low-noise amplifier 34 by the oscillation frequency from the local oscillator 36. The IF signal from the frequency synthesizer 35 is supplied to a next module via an output terminal of the CATV tuner apparatus. In the next module, a channel selection in which a specific one of the CATV channels delivered on the coaxial cable is selected is carried out.

In the CATV tuner apparatus of the present embodiment, the first low-noise amplifier 31 is connected at its input to the input terminal of the apparatus, and connected at its output to the subsequent components of the apparatus. Even if the level of the input signal Vin received at the input terminal of the apparatus is very low, the first low-noise amplifier 31 can amplify the level of the received input signal Vin into an adequately high level with no substantial degradation of the carrier-to-noise ratio (CNR). The CATV tuner apparatus of the present embodiment is effective in converting the input signal Vin at the input terminal into the IF signal at the output terminal without substantial CNR degradation.

Figure 2:
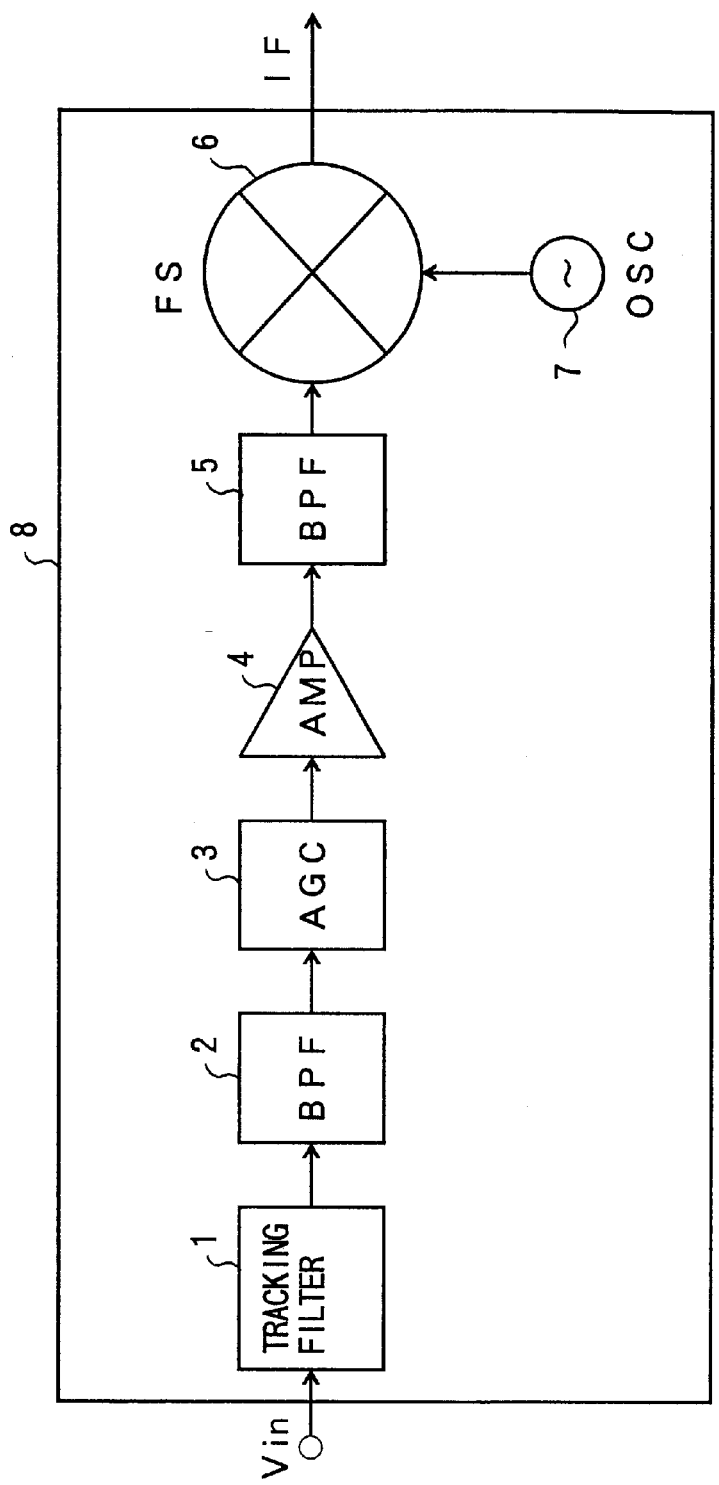
FIG. 2 is a block diagram of a CATV tuner apparatus according to the related art.

As previously described with reference to FIG. 2, in the conventional CATV tuner apparatus, the tracking filter 1, the BPF 2 and the AGC 3 will lower the level of the received input signal Vin and add a certain noise (such as a thermal noise) to the input signal Vin when the input signal Vin passes through these components. The AMP 4 amplifies not only the level of the received signal from the AGC 3 but also the level of the added noise. This amplification process by the AMP 4 will result in a significant degradation of the CNR of the IF signal, which is supplied to the output terminal, from the CNR of the input signal Vin received at the input terminal.

In the CATV tuner apparatus of the present embodiment, the first low-noise amplifier 31, the automatic gain control 32, the band-pass filter 33, the second low-noise amplifier 34, and the frequency synthesizer 35 are connected in series in this order, as shown in FIG. 1. The use of the first low-noise amplifier 31 at the input terminal and the second low-noise amplifier 34 at the output of the BPF 33 enables a minimum of noise to be added to the received input signal, and allows the CATV tuner apparatus of the present embodiment to produce a high-quality IF signal at the output terminal without substantial CNR degradation. In a case of the reception of a digital audio signal from another node in the CATV system, the CATV tuner apparatus of the present embodiment is effective in minimizing the bit error rate of the received signal and producing a high quality IF signal. Further, in a case of a CNR degradation of the received signal caused by interchannel influences, the CATV tuner apparatus of the present embodiment is effective in providing a stable signal reception capability.

The present invention is not limited to the above-described embodiment, and variations and modifications may be made without departing from the scope of the present invention.

Further, the present invention is based on Japanese priority application No.10-368,096 filed Dec. 24, 1998.

What is claimed is:

1. A cable television (CATV) tuner apparatus having an input terminal for receiving an input signal and an output terminal for producing an intermediate frequency, the CATV tuner apparatus comprising:

a first low-noise amplifier which amplifies a level of the input signal received at the input terminal, the first low-noise amplifier having a noise figure that does not add substantial noise to the received input signal passing through the first low-noise amplifier to allow the received input signal to be amplified with no substantial degradation of a carrier-to-noise ratio of the received input signal;

an automatic gain control which detects the level of the signal amplified by the first low-noise amplifier and adjusts an amplitude of the of the signal;

a band-pass filter which eliminates out-of-band noise components from the signal received from the automatic gain control and passes only in-band signal components through the band-pass filter;

a second low-noise amplifier which amplifies a level of the signal received from the band-pass filter; and a frequency synthesizer which produces the intermediate frequency signal at the output terminal through a multiplication of a frequency of the signal, amplified by the second low-noise amplifier, by an oscillation frequency.

2. The CATV tuner apparatus according to claim 1, wherein the first low-noise amplifier is connected at its input to the input terminal of the apparatus, and the automatic gain control is connected to an output of the first low-noise amplifier.

3. The CATV tuner apparatus according to claim 1, wherein the first low-noise amplifier, the automatic gain control, the band-pass filter, the second low-noise amplifier, and the frequency synthesizer are connected in series in this order.

4. The CATV tuner apparatus according to claim 1, wherein the input signal received at the input terminal is a digital audio signal.

5. The CATV tuner apparatus according to claim 1, wherein the automatic gain control is connected at its input to an output of the first low-noise. amplifier, and the automatic gain control is connected at its output to an input of th e band-pass filter.

6. The CATV tuner apparatus according to claim 1, wherein the second low-noise amplifier is connected at its input to an output of the band-pass filter, and the second low-noise amplifier is connected at its output to an input of the frequency synthesizer.

7. The CATV tuner apparatus according to claim 1, further comprising a local oscillator which generates the oscillation frequency that is supplied to the frequency synthesizer.

8. The CATV tuner apparatus according to claim 1, wherein the second low-noise amplifier is configured to have a noise figure that does not add substantial noise to the received input signal passing through the second low-noise amplifier to allow the received input signal to be amplified with no substantial degradation of a carrier-to-noise ratio of the received input signal.

* * * * *